United States Patent
Hsu et al.

(10) Patent No.: US 8,250,497 B2
(45) Date of Patent: Aug. 21, 2012

(54) METHOD FOR DESIGNING TWO-DIMENSIONAL ARRAY OVERLAY TARGET SETS AND METHOD AND SYSTEM FOR MEASURING OVERLAY ERRORS USING THE SAME

(75) Inventors: Wei Te Hsu, Banqiao (TW); Yi Sha Ku, Hsinchu (TW); Hsiu Lan Pang, Baoshan Township, Hsinchu County (TW); Deh Ming Shyu, Jhunan Township, Miaoli County (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 274 days.

(21) Appl. No.: 12/648,895

(22) Filed: Dec. 29, 2009

(65) Prior Publication Data
US 2011/0154272 A1 Jun. 23, 2011

(30) Foreign Application Priority Data
Dec. 17, 2009 (TW) ................ 98143306 A

(51) Int. Cl.
G06F 17/50 (2006.01)
G01N 21/00 (2006.01)
G01B 11/00 (2006.01)
G01B 11/14 (2006.01)
(52) U.S. Cl. ............. 716/55; 716/50; 716/51; 716/52; 716/53; 716/54; 716/56; 356/73; 356/399; 356/401; 356/622
(58) Field of Classification Search .......... 716/50–56; 356/73, 399, 401, 622
See application file for complete search history.

(56) References Cited

U.S. PATENT DOCUMENTS

| | | | | |
|---|---|---|---|---|
| 6,766,211 B1 * | 7/2004 | Ausschnitt | ............... | 700/117 |
| 6,982,793 B1 * | 1/2006 | Yang et al. | ............... | 356/401 |
| 7,061,615 B1 * | 6/2006 | Lowe-Webb | ............ | 356/401 |
| 7,230,705 B1 * | 6/2007 | Yang et al. | ............... | 356/401 |
| 7,242,477 B2 * | 7/2007 | Mieher et al. | ............. | 356/401 |
| 7,310,789 B2 * | 12/2007 | Seligson et al. | ........... | 716/52 |
| 7,473,502 B1 * | 1/2009 | Ausschnitt et al. | ......... | 430/22 |
| 7,511,797 B2 * | 3/2009 | Van De Mast et al. | ..... | 355/53 |
| 7,643,666 B2 * | 1/2010 | Setija et al. | ............... | 382/144 |
| 7,738,103 B2 * | 6/2010 | Kiers et al. | ............... | 356/392 |
| 7,746,446 B2 * | 6/2010 | Okita | ....................... | 355/53 |
| 7,808,643 B2 * | 10/2010 | Smith et al. | ............... | 356/445 |
| 7,812,943 B2 * | 10/2010 | Silver et al. | .............. | 356/237.5 |
| 7,876,440 B2 * | 1/2011 | Mieher et al. | ............. | 356/401 |
| 7,911,612 B2 * | 3/2011 | Kiers et al. | ............... | 356/399 |
| 7,933,016 B2 * | 4/2011 | Mieher et al. | ............. | 356/401 |

(Continued)

OTHER PUBLICATIONS

Yi-Sha Ku et. al, "Improved diffraction-based overlay metrology by use of two dimensional array target", SPIE Optics +Photonics Conference, 2009, San Diego, California, USA.

Primary Examiner — Helen Rossoshek
(74) Attorney, Agent, or Firm — Egbert Law Offices PLLC

(57) ABSTRACT

A method for designing a two-dimensional array overlay target set comprises the steps of: selecting a plurality of two-dimensional array overlay target sets having different overlay errors; calculating a deviation of a simulated diffraction spectra for each two-dimensional array overlay target set; selecting a sensitive overlay target set by taking the deviations of the simulated diffraction spectra into consideration; and designing a two-dimensional array overlay target set based on the structural parameters of the sensitive overlay target set.

6 Claims, 9 Drawing Sheets

U.S. PATENT DOCUMENTS

| | | | |
|---|---|---|---|
| 2004/0126004 A1* | 7/2004 | Kikuchi | 382/141 |
| 2007/0069398 A1* | 3/2007 | Smith et al. | 257/797 |
| 2008/0036984 A1* | 2/2008 | Mos et al. | 355/53 |
| 2008/0094642 A1* | 4/2008 | Okita | 356/622 |
| 2008/0106714 A1* | 5/2008 | Okita | 355/53 |
| 2008/0294280 A1* | 11/2008 | Okita | 700/108 |
| 2009/0135399 A1* | 5/2009 | Hirukawa et al. | 355/71 |
| 2009/0262362 A1* | 10/2009 | de Groot et al. | 356/508 |
| 2009/0296075 A1* | 12/2009 | Hu et al. | 356/73 |
| 2009/0313589 A1* | 12/2009 | Hsu et al. | 716/4 |
| 2011/0073775 A1* | 3/2011 | Setija et al. | 250/492.1 |
| 2011/0085176 A1* | 4/2011 | Cramer et al. | 356/601 |
| 2011/0131538 A1* | 6/2011 | Ku et al. | 716/50 |
| 2011/0218789 A1* | 9/2011 | Van Beurden | 703/13 |
| 2011/0229830 A1* | 9/2011 | Bhattacharyya et al. | 430/325 |
| 2011/0320986 A1* | 12/2011 | Hsu et al. | 716/52 |

* cited by examiner

METHOD FOR DESIGNING TWO-DIMENSIONAL ARRAY OVERLAY TARGET SETS AND METHOD AND SYSTEM FOR MEASURING OVERLAY ERRORS USING THE SAME

CROSS-REFERENCE TO RELATED APPLICATIONS

Not applicable.

STATEMENT REGARDING FEDERALLY SPONSORED RESEARCH OR DEVELOPMENT

Not applicable.
NAMES OF THE PARTIES TO A JOINT RESEARCH AGREEMENT
Not applicable.

INCORPORATION-BY-REFERENCE OF MATERIALS SUBMITTED ON A COMPACT DISC

Not applicable.

BACKGROUND OF THE INVENTION

1. Field of the Invention

The disclosure relates generally to a system and method for measuring an overlay error, and more particularly, to a method for designing a two-dimensional (2-D) array overlay target set having two 2-D array overlay targets and a method and system for measuring overlay errors using the same.

2. Description of Related Art

Including Information Disclosed Under 37 CFR 1.97 and 37 CFR 1.98.

Continuing improvements in semiconductor process technology have increased the accuracy required for overlay measurement. According to the ITRS (International Technology Roadmap for Semiconductor) the overlay tolerance in the semiconductor process is about one-sixth of line width, and the corresponding metrology error budget is only about one-sixtieth of line width. Therefore, due to diffraction limitations and proximity effects, conventional image-based overlay metrology cannot meet the accuracy requirements for the next-generation structural parameter measurement. Diffraction-based metrology, which is different from image-based overlay metrology and is not influenced by the proximity effects, has high repeatability and reproducibility characteristics and will become an important overlay measurement technology.

An overlay measurement system using diffraction-based metrology technology is composed of a scatterometer and a program for matching analysis, wherein the analysis technique can be a theoretical model-based method or an empirical model-based method. The spectrum of the theoretical model-based method is calculated using a theory such as a Rigorous Coupled Wave Theory (RCWT) or a Finite Difference Time Domain (FDTD) theory and is compared with a measured spectrum to find the overlay error. In practice, the parameters such as line widths, thickness, sidewall angles, and overlay errors are typically strongly correlated, and any incorrect parameter will result in incorrect overlay calculation.

The empirical model-based method compares measured data with an empirical regression line, which approximates the data obtained and analyzed by measuring the diffraction spectra formed by a series of at least four gratings having different overlay deviation patterns. These gratings are fabricated on a wafer. The advantage of this method is that it does not require a lot of simulations for setting up a matching database, and therefore there is no strong correlation problem between the parameters. However, one disadvantage of this method is that many gratings must be fabricated and measured on a semiconductor wafer for gathering the library data, which requires a lot of time.

BRIEF SUMMARY OF THE INVENTION

The present disclosure provides a method for designing a 2-D array overlay target set, and a method and system for measuring an overlay error. In one aspect, the present disclosure can eliminate strong correlation problems among structural parameters, so as to achieve a sensitive measurement for measuring an overlay error. In another aspect, the disclosure invention reduces the work of fabricating overlay targets on a semiconductor wafer and measuring the diffraction spectrum formed by the gratings.

According to an embodiment of the present disclosure, a method for designing a 2-D array overlay target set is disclosed. First, a plurality of 2-D array overlay target sets having different overlay errors are selected. Then, a deviation of simulated diffraction spectra for each 2-D array overlay target set is calculated. Next, a sensitive overlay target set is selected by taking the deviations of the simulated diffraction spectra of 2-D overlay array target sets into consideration. Finally, a 2-D array overlay target set is designed based on the structural parameters of the sensitive overlay target set.

According to another embodiment of the present disclosure, a method for measuring an overlay error is disclosed. First, a measured diffraction spectra of a 2-D array overlay target set to be measured is measured. Then, a deviation of the measured diffraction spectra of the 2-D array overlay target to be measured is calculated. Next, a matching process is performed to find a matched deviation in a database, wherein the database stores deviations of simulated diffraction spectra of a plurality of 2-D array overlay target sets and corresponding overlay errors thereof. Finally, an overlay error of the 2-D array overlay target set to be measured is determined in accordance with the matched deviation.

According to another embodiment of the present disclosure, a system for measuring overlay error is disclosed. The system includes an angular scatterometer, a data processing module, a database and a matching unit. The angular scatterometer is utilized to acquire a measured spectrum of a 2-D array overlay target set to be measured. The data processing module is configured to calculate a deviation of the measured diffraction spectra for the 2-D array overlay target set to be measured. The database is utilized to store deviations of simulated diffraction spectra of a plurality of 2-D array overlay target sets and corresponding overlay errors thereof. The matching unit is utilized to compare the deviations of the simulated diffraction spectra in the database with the deviation of the measured diffraction spectrum calculated by the data processing module, so as to obtain an overlay error of the 2-D array overlay target to be measured.

BRIEF DESCRIPTION OF THE SEVERAL VIEWS OF THE DRAWINGS

The accompanying drawings, which are incorporated in and constitute a part of this specification, illustrate embodiments of the disclosure and, together with the description, serve to explain the principles of the invention.

DETAILED DESCRIPTION OF THE INVENTION

One primary feature of the present disclosure is the application of a deviation of the simulated diffraction spectra of a 2-D array overlay target set including two 2-D array overlay targets. In one aspect, the present disclosure eliminates strong correlation problems among structural parameters. In another aspect, the present disclosure generates enough theoretical model-based data to reduce the work of fabricating overlay targets on a semiconductor wafer and measuring the diffraction spectra formed by the overlay targets.

Figure 1:
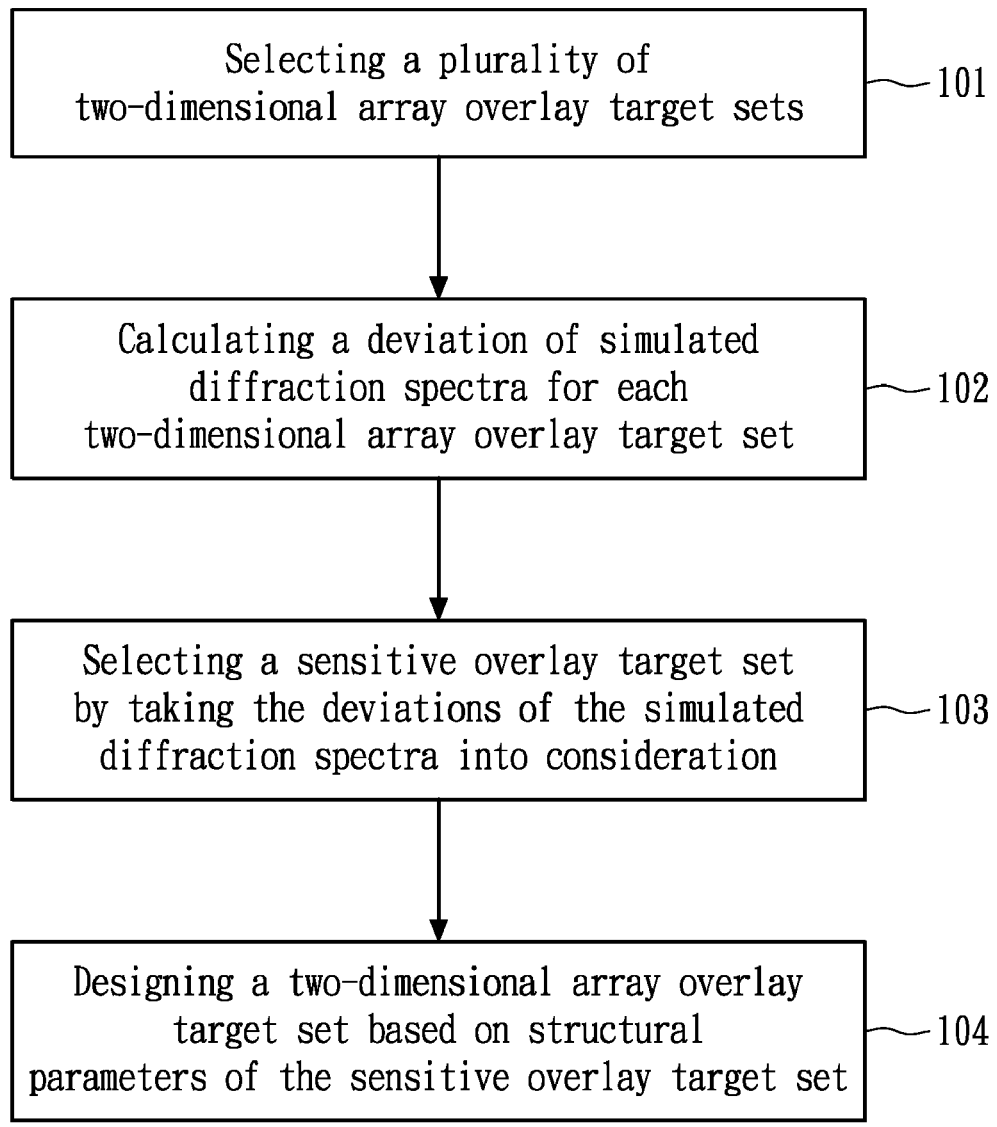
FIG. 1 shows a schematic view of a method for designing a 2-D array overlay target set according to an embodiment of the present disclosure.
Figure 2A:
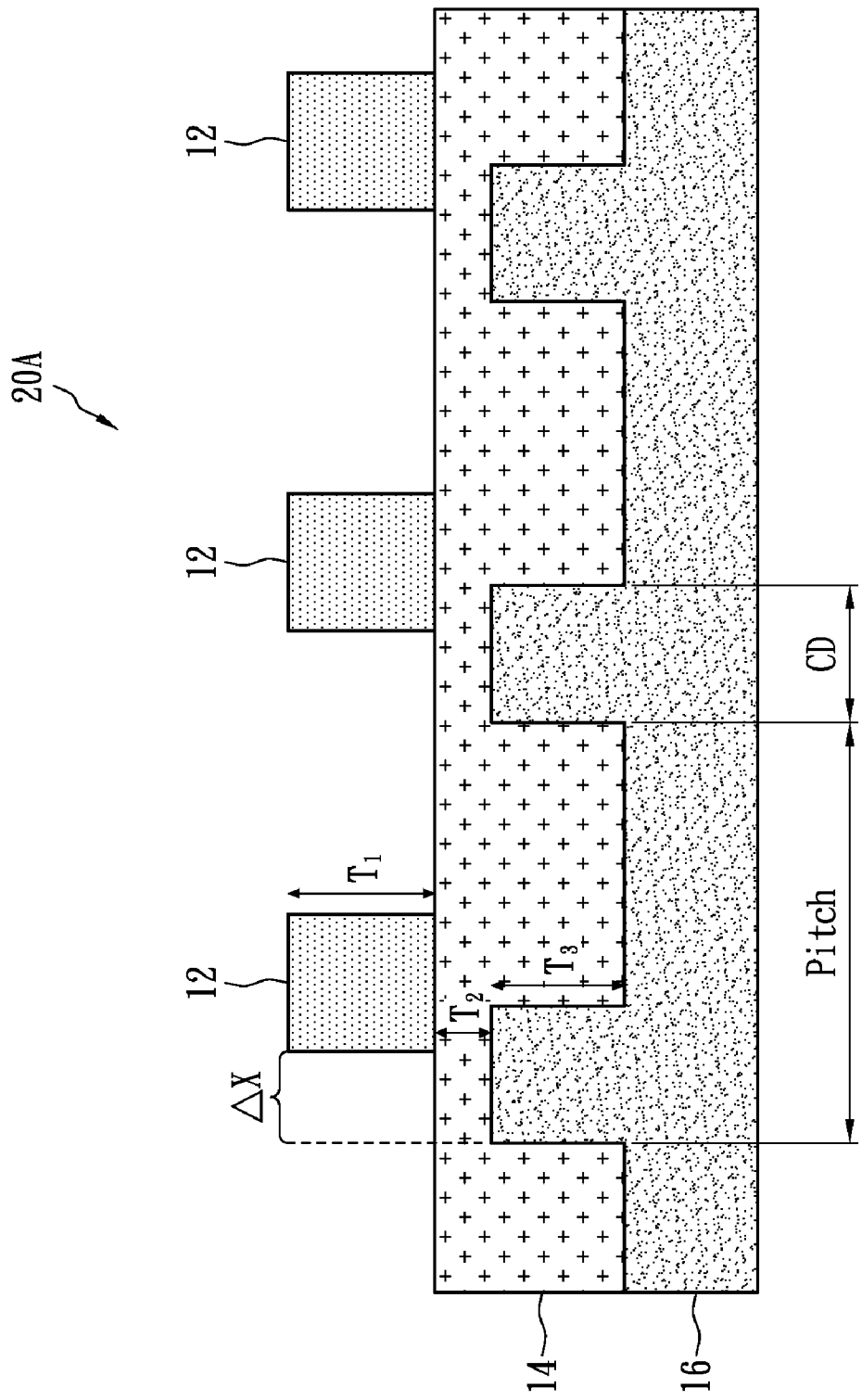
FIG. 2A shows a side view of a 2-D array overlay target set.
Figure 2B:
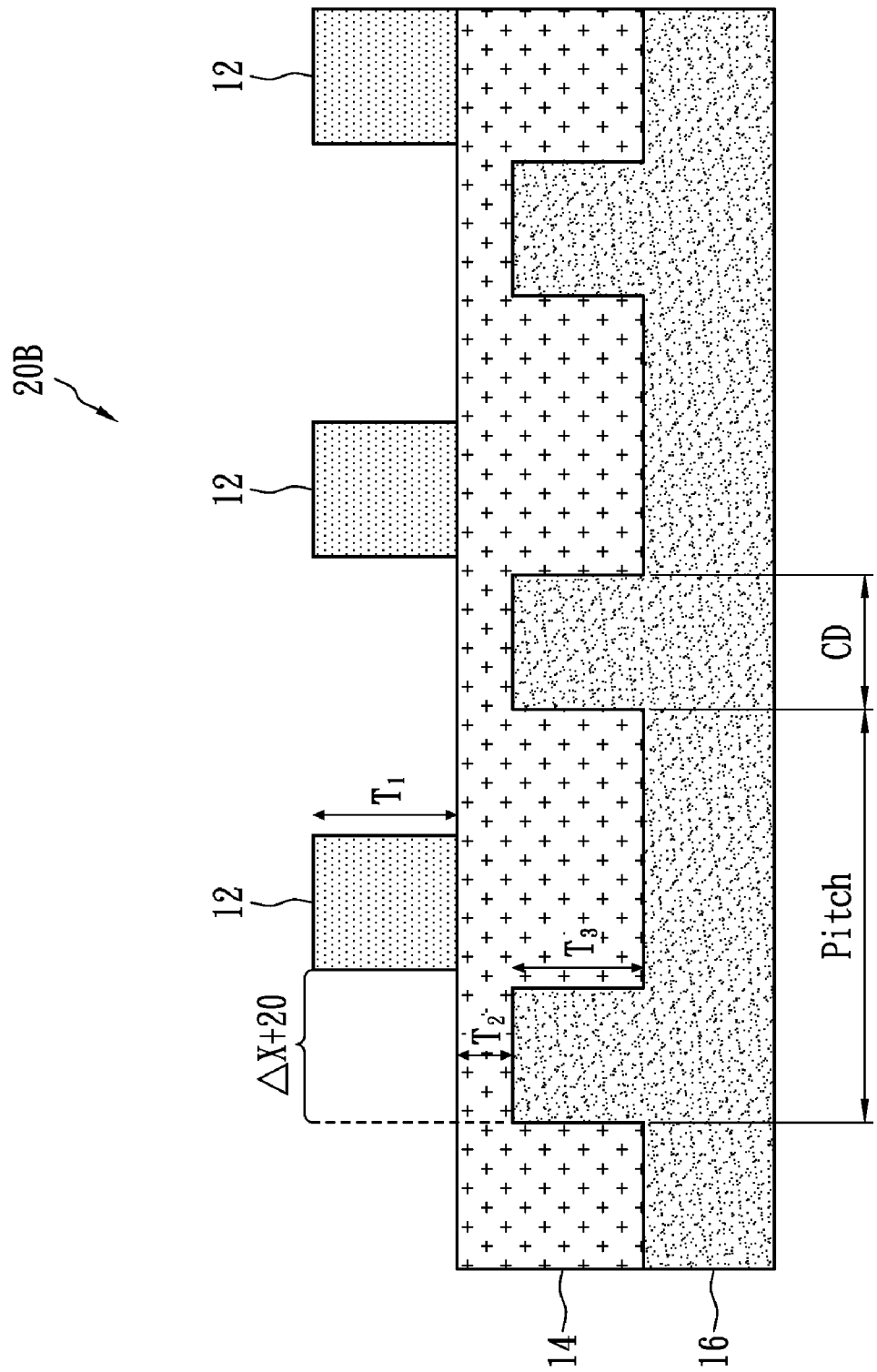
FIG. 2B shows another side view of a 2-D array overlay target set.
Figure 3A:
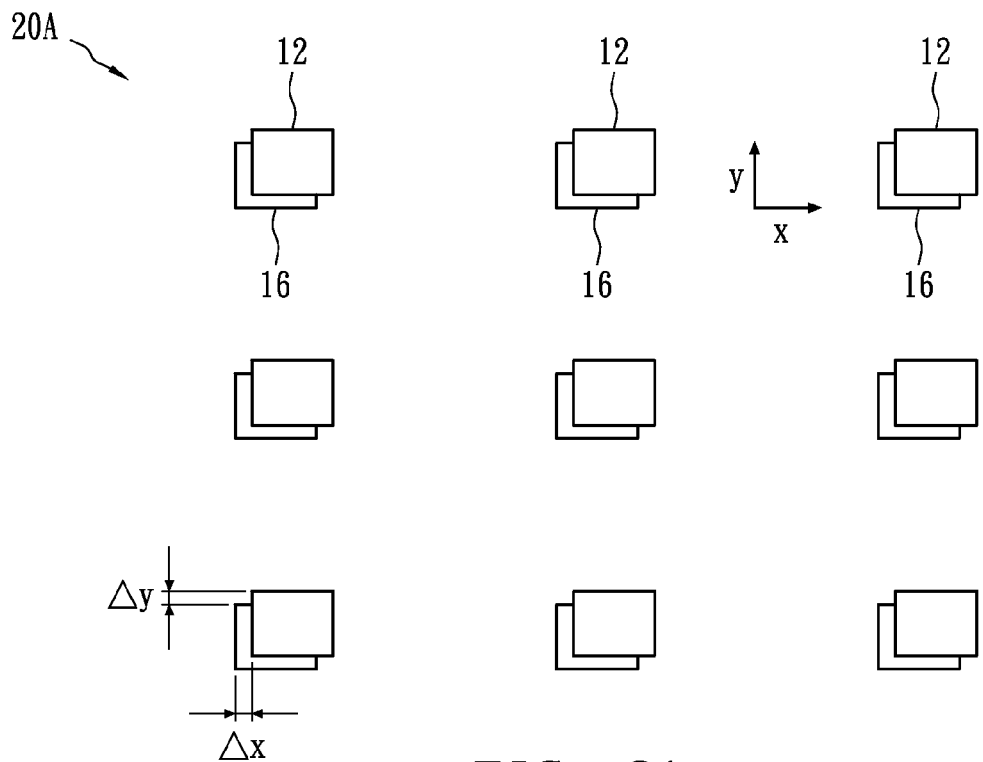
FIG. 3A shows a top view of a 2-D array overlay target set.
Figure 3B:
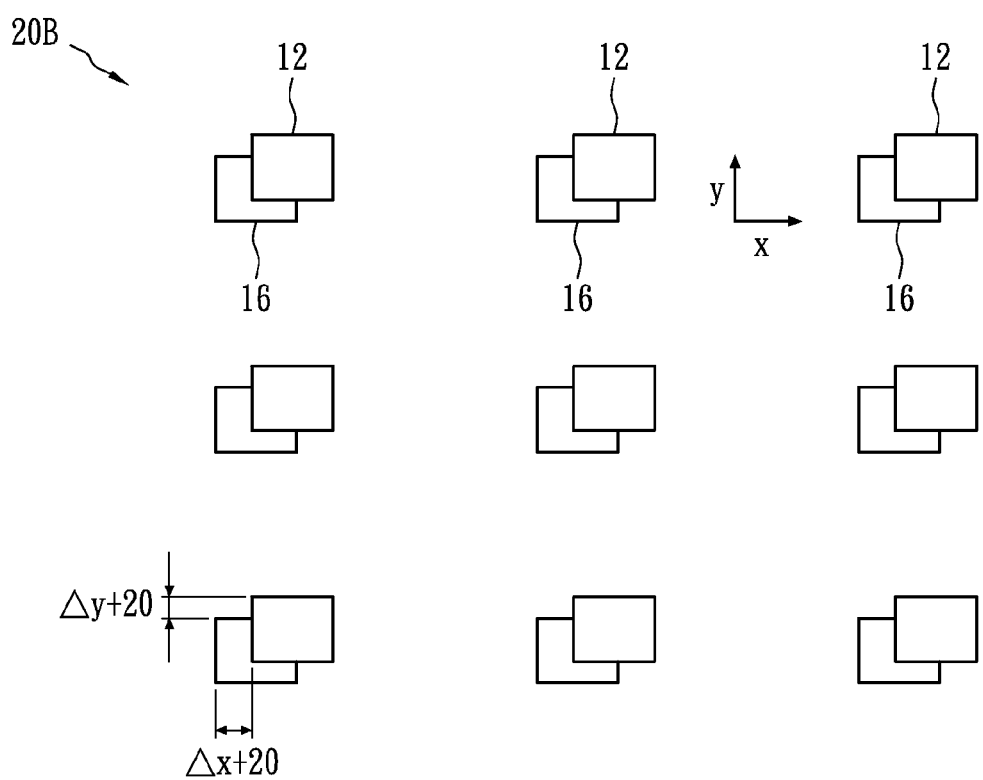
FIG. 3B shows another top view of a 2-D array overlay target set.

FIG. 1 shows a flowchart of a method for designing a 2-D array overlay target set according to an embodiment of the present disclosure. First, in step 101, a plurality of 2-D array overlay target sets having different overlay errors are selected. According to an exemplary embodiment, FIGS. 2A and 2B show side views of a 2-D array overlay target set comprising 2-D array overlay targets 20A and 20B. Each of the 2-D array overlay targets 20A and 20B comprises an upper 2-D array grating structure 12, a medium layer 14 and a lower 2-D array grating structure 16. Both the 2-D array overlay targets 20A and 20B have the same structural parameters, but the overlay errors existing in the upper 2-D array grating structure 12 and the lower 2-D array grating structure 16 are different. For example, both the 2-D array overlay targets 20A and 20B have the same grating pitch, critical dimension line width, sidewall angle, and thicknesses (T1, T2 and T3). However, the overlay error of the 2-D array overlay targets 20A is a setting overlay error $\Delta x$, and the overlay error of the 2-D array overlay targets 20B is the sum of the setting overlay error $\Delta x$ and a fixed offset. In accordance with an exemplary embodiment, the fixed offset can be, but is not limited to, 20 nm. Persons skilled in the art realize that the fixed offset varies with overlay targets having different structural parameters. Corresponding to FIG. 2A and FIG. 2B, FIG. 3A and FIG. 3B illustrate top views of the 2-D array overlay targets 20A and 20B.

In step 102, a deviation of simulated diffraction spectra for each 2-D array overlay target set is calculated. In this exemplary embodiment, the deviation is a root mean square error (RMSE) value. Once the structural parameters, overlay errors ($\Delta x$ and $\Delta y$) of a 2-D array overlay target set are determined, spectra under such conditions can be simulated. For example, spectra of the 2-D overlay array target sets in FIG. 3A and FIG. 3B can be simulated with a rigorous coupled-wave theory (RCWT) and then the deviation of the spectra is calculated.

Figure 4:
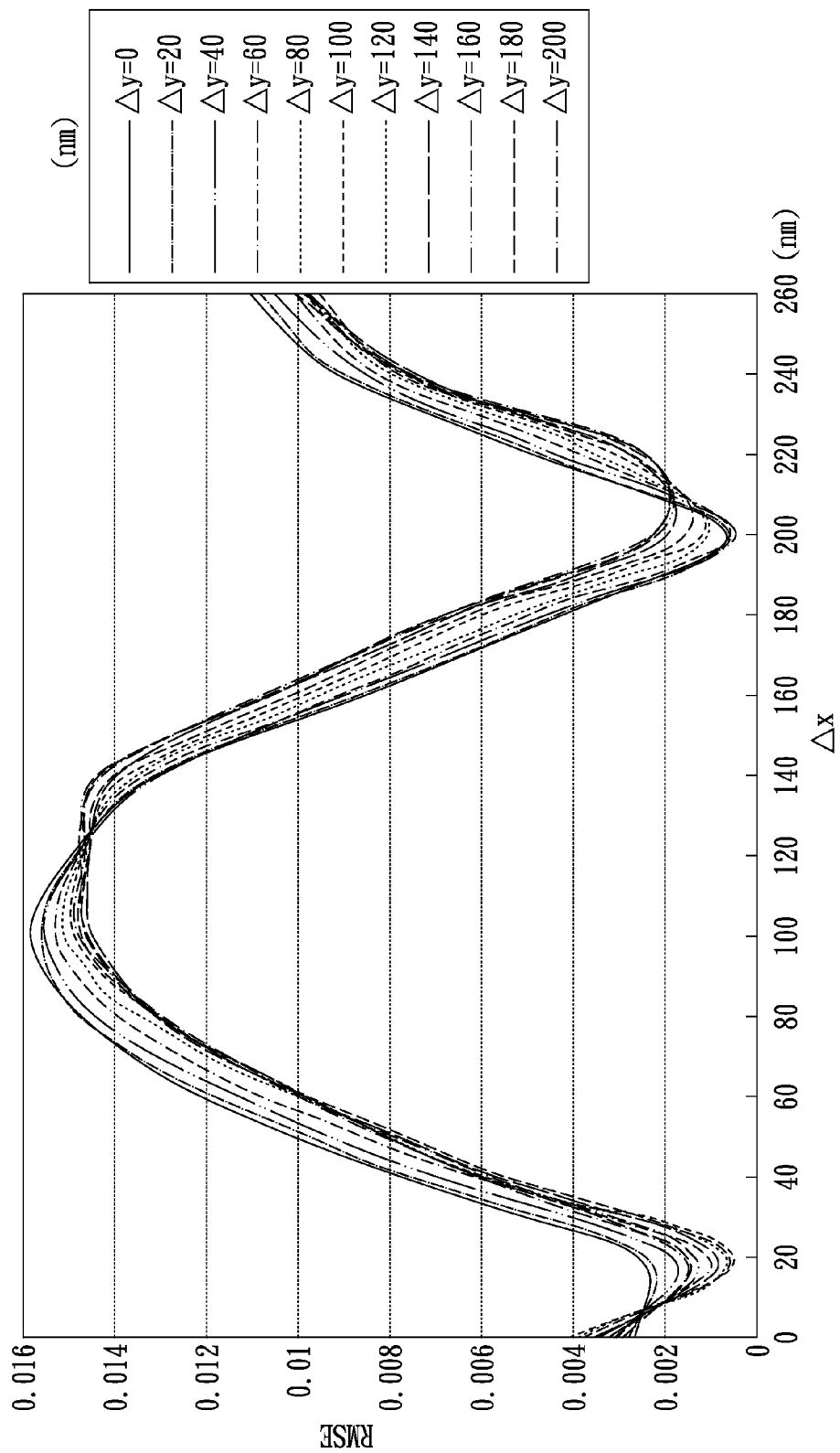
FIG. 4 shows a graphical view of RMSE value as a function of $\Delta x$.

In step 103, a sensitive overlay target set is selected by taking the deviations of the simulated diffraction spectra of each 2-D overlay array target set into consideration. In accordance with an exemplary embodiment, the spectrum difference curves of FIG. 4 can be obtained by varying the overlay errors of the 2-D overlay array targets in FIG. 3A and FIG. 3B. FIG. 4 shows a diagram of RMSE value as a function of $\Delta x$ under the condition of specific $\Delta y$ (0 nm, 20 nm, 40 nm, 60 nm, 80 nm, 100 nm, 120 nm, 140 nm, 160 nm, 180 nm and 200 nm).

Figure 5:
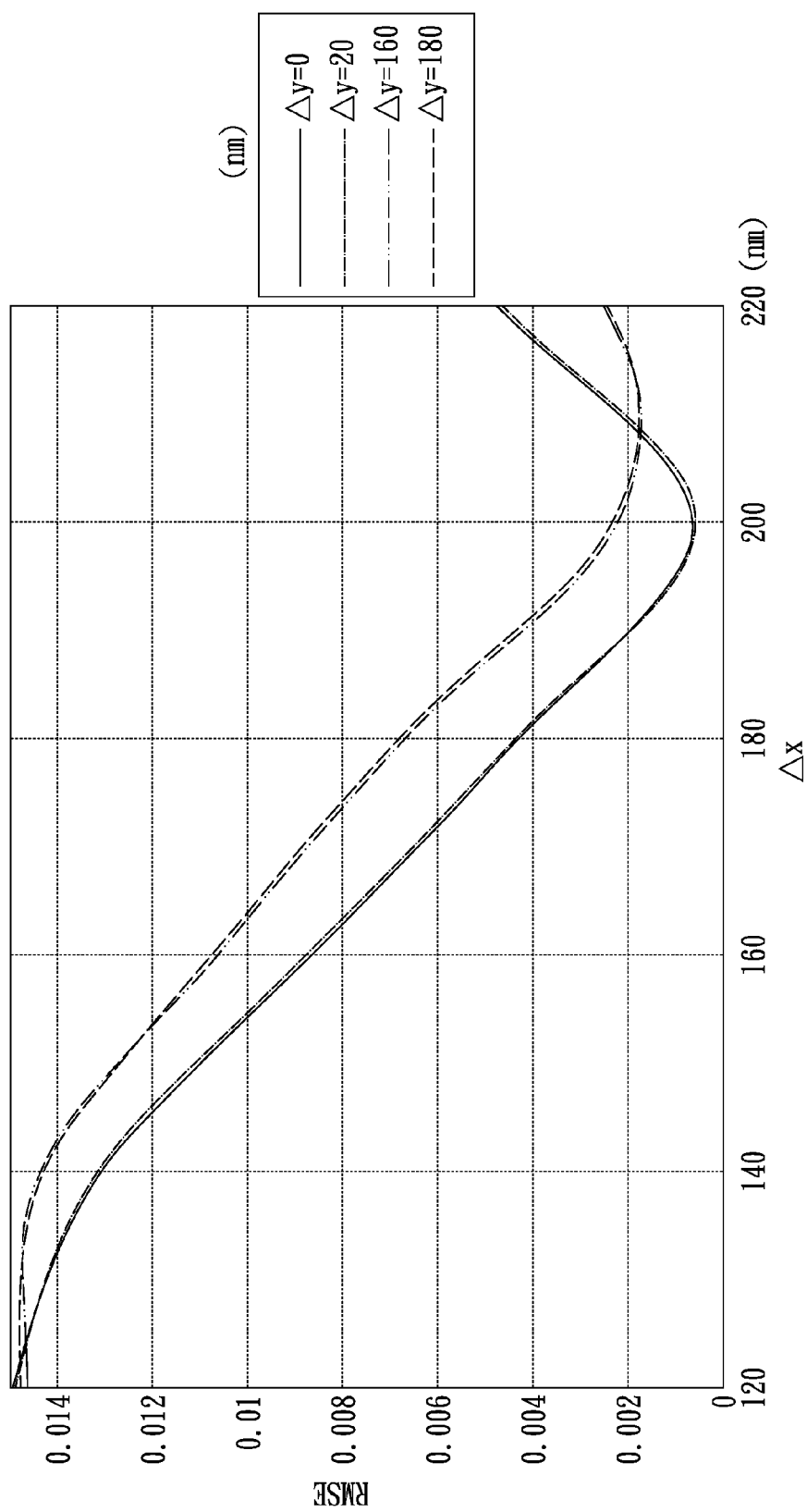
FIG. 5 shows a graphical view of the curves to be possibly selected.
Figure 6A:
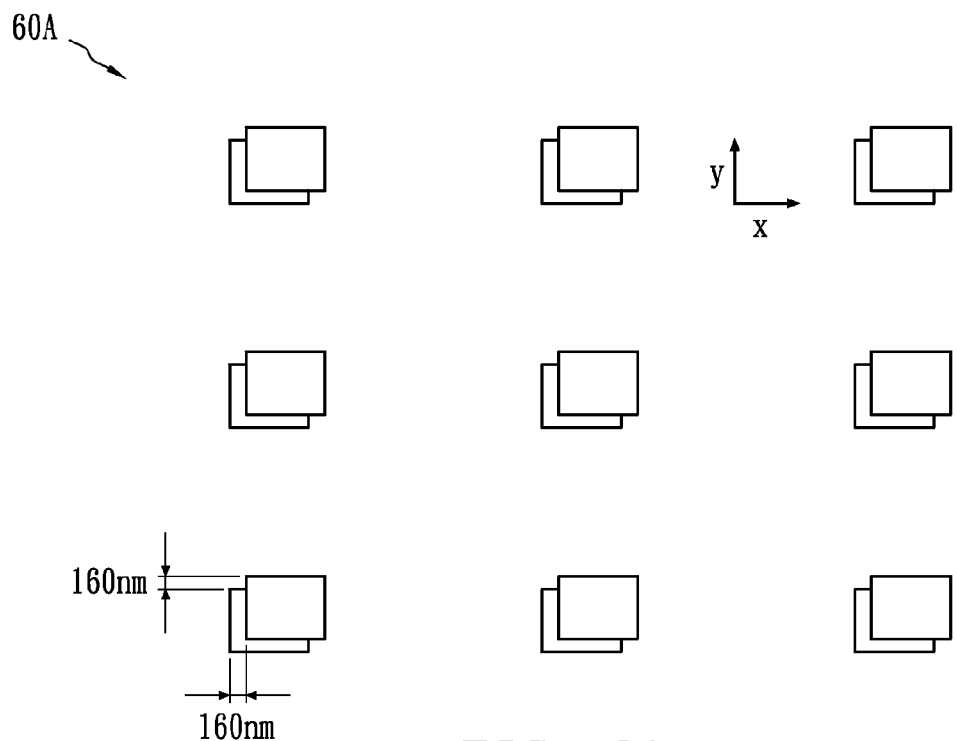
FIG. 6A shows a top view of a designed 2-D array overlay target.
Figure 6B:
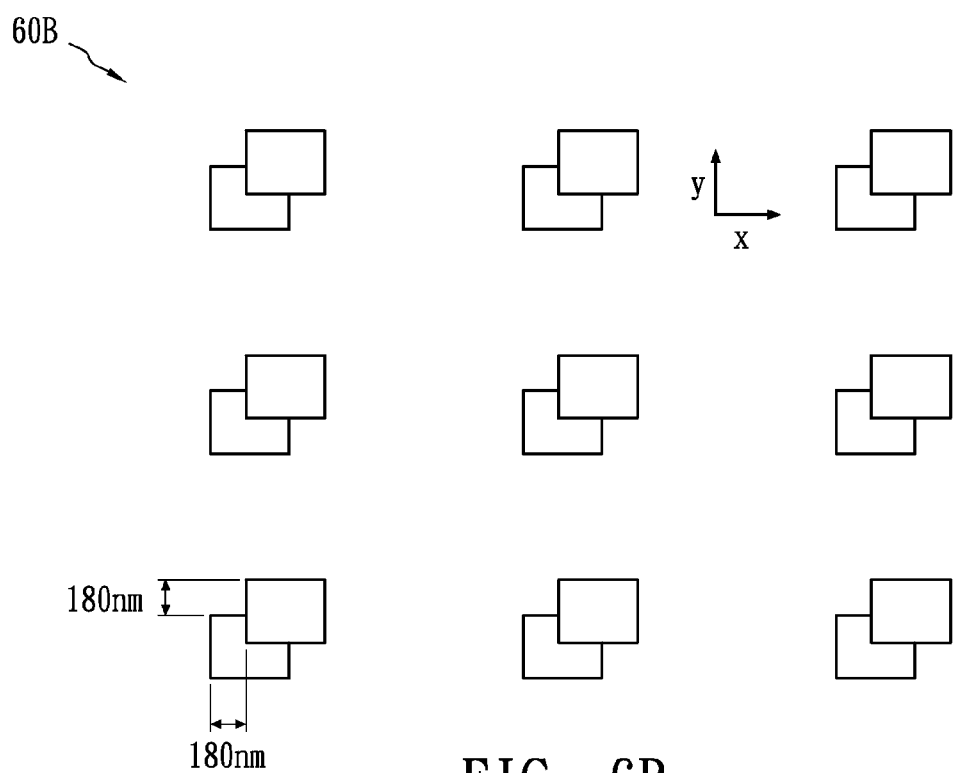
FIG. 6B shows another top view of a designed 2-D array overlay target.

FIG. 5 shows the curves to be possibly selected. In accordance with an exemplary embodiment, the curves of $\Delta y=0$ nm and $\Delta y=160$ nm exhibit larger slopes in the range of $\Delta x=140$-200 nm. In order to design a 2-D overlay array target set with symmetric characteristic, the overlay errors in the x-axis direction and in the y-axis of the two 2-D overlay array targets of the sensitive overlay target set selected in this exemplary embodiment are (160 nm, 160 nm) and (180 nm, 180 nm) respectively. If an overlay target set of a wafer is designed with the structural parameters of the sensitive overlay target set, the overlay measurement will be more efficient and less influenced by structural parameters. Finally, in step 104, a 2-D array overlay target set is designed based on the structural parameters of the sensitive overlay target set selected in step 103. FIG. 6A and FIG. 6B show respectively top views of the designed 2-D array overlay targets.

In addition, if a database stores the deviation of the simulated diffraction spectra of each 2-D array overlay target set and their corresponding structural parameters, the deviations of the simulated spectra stored in the database can be used to find a matched deviation of a measured diffraction spectra of a 2-D array overlay target set to be measured. Then, the overlay error of the measured 2-D array overlay target set to be measured can be found according to the corresponding overlay target set of the matched deviation.

Figure 7:
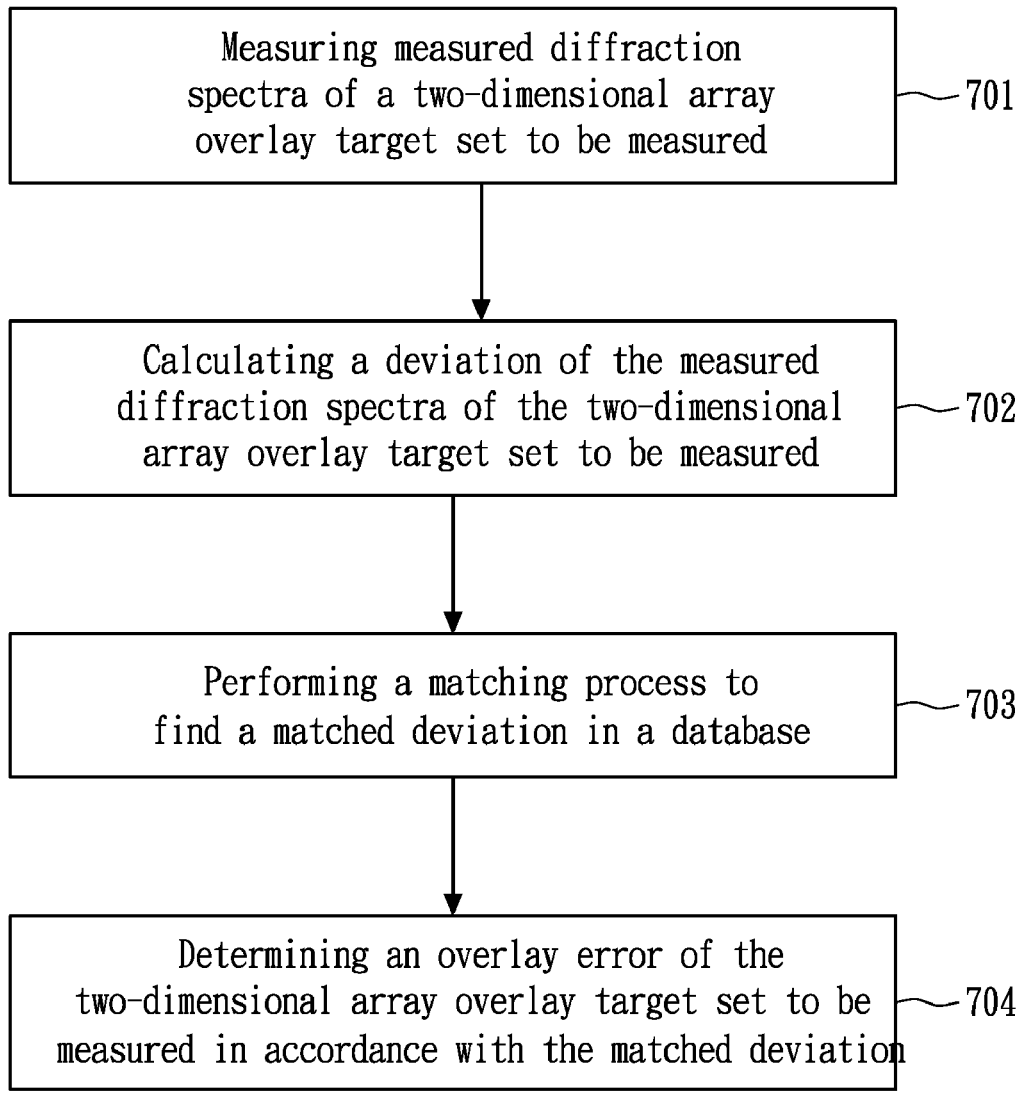
FIG. 7 shows a schematic view of a method for measuring an overlay error according to another embodiment of the present disclosure.

FIG. 7 shows a flowchart of a method for measuring an overlay error according to another embodiment of the present disclosure. First, in step 701, a measured diffraction spectra of a 2-D array overlay target set to be measured is measured. In step 702, a deviation of the measured diffraction spectra of the 2-D array overlay target set to be measured is calculated. The 2-D array overlay target set to be measured comprises two 2-D array overlay targets. Each of the two 2-D array overlay targets comprises an upper 2-D array grating structure, a medium layer and a lower 2-D array grating structure. Next, in step 703, a matching process is performed to find a matched deviation in a database, wherein the database stores deviations of simulated diffraction spectra of a plurality of 2-D array overlay target sets and corresponding overlay errors thereof. Finally, in step 704, an overlay error of the 2-D array overlay target set to be measured is determined in accordance with the matched deviation.

To further clarify, the method of establishing a database initially selects the plurality of 2-D array overlay target sets, wherein the 2-D array overlay target sets have different overlay errors. Then, the deviation of the simulated diffraction spectra for each 2-D array overlay target set is calculated. Each 2-D array overlay target set comprises a first 2-D array overlay target and a second 2-D array overlay target, and a fixed offset exists between an overlay error of the first 2-D array overlay target and an overlay error of the second 2-D array overlay target. The first 2-D array overlay target or the second 2-D array overlay target comprises an upper 2-D array grating structure, a medium layer and a lower 2-D array grating structure. The upper 2-D array grating structure and the lower 2-D array grating structure have the same grating pitch, critical dimension line width and sidewall angle. In accordance with an exemplary embodiment, the fixed offset can be, but is not limited to, 20 nm. Person skilled in the art realize that the fixed offset varies with overlay targets having different structural parameters.

In addition, the method for calculating the deviation of the simulated diffraction spectra for each 2-D array overlay target set comprises the steps of: generating the simulated diffraction spectrum for the first 2-D array overlay target and generating the simulated diffraction spectrum for the second 2-D array overlay target; and calculating the deviation of the simulated diffraction spectra of the first 2-D array overlay target and the second 2-D array overlay target. The deviation is an RMSE value. The simulated diffraction spectra for the first 2-D array overlay target and the second 2-D array overlay target can be generated by utilizing a rigorous coupled wave theory.

Figure 8:
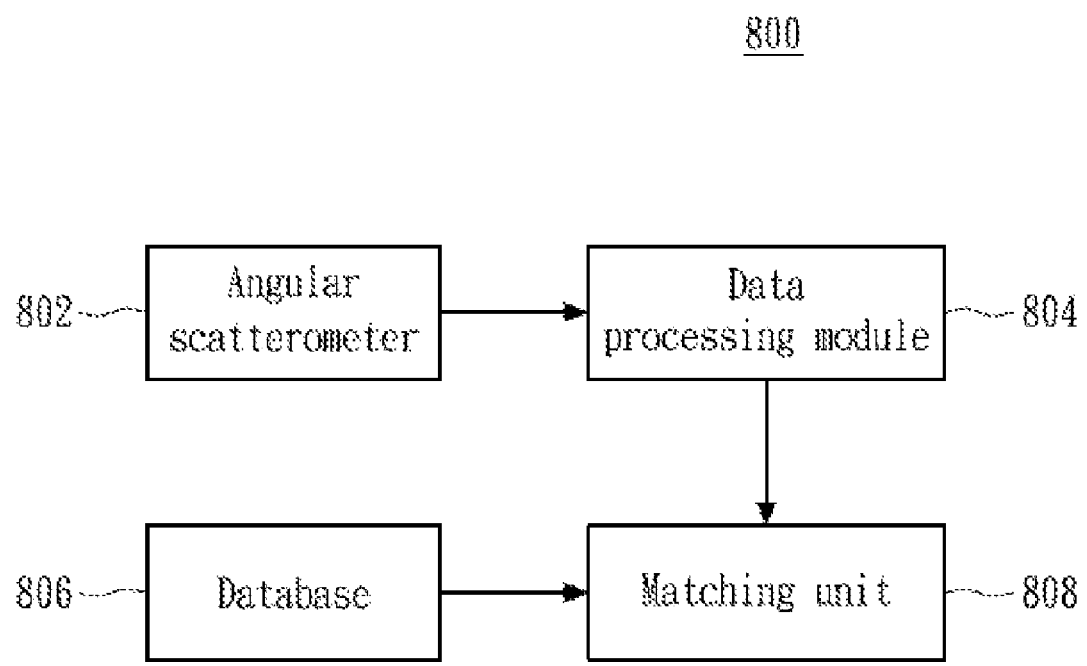
FIG. 8 illustrates schematic view of a system for measuring overlay errors according to another exemplary embodiment of the present disclosure.

FIG. 8 illustrates a system for measuring overlay errors according to another exemplary embodiment of the present disclosure. The system 800 includes an angular scatterometer 802, a data processing module 804, a database 806 and a matching unit 808. The angular scatterometer 802 is utilized to acquire measured spectra of a 2-D array overlay target set to be measured. The 2-D array overlay target set to be measured comprises two 2-D array overlay targets. Each of the two 2-D array overlay targets comprises an upper 2-D array grating structure, a medium layer and a lower 2-D array grating structure. The data processing module 804 is utilized to perform the step of obtaining a deviation of the measured diffraction spectra of the 2-D array overlay target set to be measured. The deviation is an RMSE value. The database 806 is utilized to store deviations of simulated diffraction spectra of a plurality of 2-D array overlay target sets and corresponding overlay errors thereof. The plurality of 2-D array overlay target sets have different overlay errors while each 2-D array overlay target set comprises a third 2-D array overlay target and a fourth 2-D array overlay target. A fixed offset exists between an overlay error of the third 2-D array overlay target and an overlay error of the fourth 2-D array overlay target. The third 2-D array overlay target or the fourth 2-D array overlay target comprises an upper 2-D array grating structure, a medium layer and a lower 2-D array grating structure. The upper 2-D array grating structure and the lower 2-D array grating structure have the same grating pitch, critical dimension line width and sidewall angle. The method of establishing the database 806 is same as the method of establishing the database mentioned above. The matching unit 808 is utilized to compare the deviations of the simulated diffraction spectra in the database 806 with the deviation of the measured diffraction spectra calculated by the data processing module 804, so as to obtain an overlay error of the 2-D array overlay target set to be measured.

The above-described exemplary embodiments are intended to be illustrative of the invention principle only. Those skilled in the art may devise numerous alternative embodiments without departing from the scope of the following claims.

We claim:

1. A method for measuring an overlay error using a system having an angular scatterometer, a data processing module, a matching unit and a database, and using a computer system, the method comprising the steps of:

providing a two-dimensional array overlay target set to be measured, wherein the step of providing the two-dimensional array comprises:
simulating diffraction spectra for a plurality of two-dimensional array overlay target sets, each of said plurality of two-dimensional array overlay target sets having at least one of a different first-dimensional overlay error and a different second-dimensional overlay error using the computer system, wherein each two-dimensional array overlay target set has a first two-dimensional array overlay target and a second two-dimensional array overlay target, a fixed offset existing between the first-dimensional overlay errors and between the second-dimensional overlay errors of the first two-dimensional array overlay target and the second two-dimensional array overlay target;
calculating a root mean square error of the simulated diffraction spectra for each two-dimensional array overlay target set using the computer system and storing the calculated root mean square error in the database;
generating a curve of root mean square error as a function of first-dimensional overlay error for each second-dimensional overlay error using the computer system;
selecting a sensitive overlay target set by taking slopes of the curves into consideration using the computer system; and
designing the two-dimensional array overlay target set to be measured based on structural parameters of the sensitive overlay target set;
measuring diffraction spectra of the two-dimensional array overlay target set to be measured using the angular scatterometer;
calculating a root mean square error of the measured diffraction spectra of the two-dimensional array overlay target set to be measured using the data processing module;
performing a matching process to find a root mean square error in the database matched with the root mean square error of the measured diffraction spectra of the two-dimensional array overlay target set to be measured using the matching unit; and
determining a first-dimensional overlay error and a second-dimensional overlay error of the two-dimensional array overlay target set to be measured in accordance with the matched root mean square error using the matching unit.

2. The method of claim 1, wherein the first two-dimensional array overlay target or the second two-dimensional array overlay target comprises a first two-dimensional array grating structure and a second two-dimensional array grating structure.

3. The method of claim 2, wherein the first two-dimensional array grating structure and the second two-dimensional array grating structure have the same grating pitch and critical dimension line width and sidewall angle.

4. The method of claim 1, wherein a rigorous coupled wave theory is utilized for generating the simulated diffraction spectra of the first two-dimensional array overlay target and the second two-dimensional array overlay target.

5. A system for measuring an overlay error comprising:
a computer system for providing a two-dimensional array overlay target set to be measured, wherein the computer system performs the steps of:
simulating diffraction spectra for a plurality of two-dimensional array overlay target sets, each of said plurality of two-dimensional overlay target sets having at least one of a different first-dimensional overlay error and a different second-dimensional overlay error, wherein each two-dimensional array overlay target set has a first two-dimensional array overlay target and a second two-dimensional array overlay target, a fixed offset existing between the first-dimensional overlay errors and between the second-dimensional overlay errors of the first two-dimensional array overlay target and the second two-dimensional array overlay target;

calculating a root mean square error of the simulated diffraction spectra for each two-dimensional array overlay target set;

generating a curve of root mean square error as a function of first-dimensional overlay error for each second-dimensional overlay error; and selecting a sensitive overlay target set by taking slopes of the curves into consideration;

an angular scatterometer configured to measure diffraction spectra of the two-dimensional array overlay target set to be measured which is designed based on structural parameters of the sensitive overlay target set;

a data processing module configured to calculate a root mean square error of the measured diffraction spectra for the two-dimensional array overlay target set to be measured;

a database configured to store the root mean square errors of the simulated diffraction spectra of the plurality of two-dimensional array overlay target sets and the corresponding first-dimensional overlay errors and second-dimensional overlay errors thereof; and a matching unit configured to compare the root mean square errors of the simulated diffraction spectra in the database with the root mean square error of the measured diffraction spectra calculated by the data processing module so as to obtain a matched first-dimensional overlay error and second-dimensional overlay error.

6. The system of claim 5, wherein the first two-dimensional array overlay target or the second two-dimensional array overlay target comprises a first two-dimensional array grating structure and a second two-dimensional array grating structure.

* * * * *